United States Patent [19]

Tokiguchi et al.

[11] Patent Number: 4,658,143
[45] Date of Patent: Apr. 14, 1987

[54] ION SOURCE

[75] Inventors: Katsumi Tokiguchi, Machida; Hidemi Koike, Tokorozawa; Noriyuki Sakudo, Ome; Osami Okada, Chofu; Ken Ninomiya, Tokyo; Susumu Ozasa, Kashiwa, all of Japan

[73] Assignee: Hitachi, Ltd., Tokyo, Japan

[21] Appl. No.: 711,824

[22] Filed: Mar. 14, 1985

[30] Foreign Application Priority Data

Mar. 16, 1984 [JP] Japan ................................ 59-49064
Mar. 16, 1984 [JP] Japan ................................ 59-49065

[51] Int. Cl.⁴ .............................................. H01J 27/00
[52] U.S. Cl. ........................... 250/423 R; 315/111.81
[58] Field of Search .............. 250/423 R, 492.2, 288; 315/39, 111.81

[56] References Cited

U.S. PATENT DOCUMENTS

| | | | |
|---|---|---|---|
| 3,960,605 | 6/1976 | Beck | 148/1.5 |
| 4,139,772 | 2/1979 | Williams | 250/423 R |
| 4,175,234 | 11/1979 | Hunt et al. | 250/423 R |
| 4,316,090 | 2/1982 | Sakudo et al. | 250/423 R |
| 4,318,028 | 3/1982 | Perel et al. | 250/423 R |
| 4,393,333 | 7/1983 | Sakudo et al. | 315/111.81 |
| 4,447,773 | 5/1984 | Aston | 315/111.81 |

*Primary Examiner*—Bruce C. Anderson
*Attorney, Agent, or Firm*—Antonelli, Terry & Wands

[57] ABSTRACT

An ion source equipped with an ion beam exit slit for extracting ions from plasma generated in feed gas introduced into a discharge chamber, and with gas inlet or inlets for introducing the feed gas into the discharge chamber in close proximity of the ion beam exit slit. Ion extraction can be made stably without any deposit on the ion beam exit slit even when a boron halide is used as the feed gas. The effect of the ion source can be further enhanced by adding oxygen, hydrogen or gas of an oxygen-containing compound to the feed gas, and by using a microwave.

33 Claims, 12 Drawing Figures

ION SOURCE

BACKGROUND OF THE INVENTION

This invention relates to an ion source for an ion implanter, an ion milling machine or the like, and more particularly to an ion source suitable for obtaining a stable ion beam for an extended period of time, and further particularly to a microwave ion source suitable for obtaining a $B^+$ ion beam.

FIG. 1 is a schematic illustration of the structure of a conventional microwave ion source.

The microwave ion source consists of rectangular waveguides 2a and 2b as the waveguide for propagating a microwave, discharge electrodes 4 constituting a ridged waveguide structure, a discharge chamber 5 made of boron nitride and disposed between the ridged waveguides, and extraction electrodes 8a, 8b and 8c which extract the ion beam 21. An axial magnetic field generated by the excitation of a coil 13 is applied to the discharge chamber 5, and a feed gas for discharge is introduced into the discharge chamber 5 through a gas introduction pipe 6.

FIG. 2 shows in detail the discharge chamber and portions near the chamber. FIG. 3 is a sectional view of the discharge chamber 5 and portions near the chamber, and is useful for explaining the discharge chamber 5, a gas inlet 10 and an ion beam exit slit 7. In the drawings, reference numeral 1 represents a microwave generator; 3 is a microwave introducing flange; 5a is a lining of the discharge chamber 5; 7a is a portion near the ion beam exit slit; 11 is a dielectric filler; and 12 is an insulator.

$PH_3$ (phosphine), $AsH_3$ (arsine) or the like as a hydride is used as the feed gas in order to obtain the beam of $P^+$ (phosphorus) ion, $As^+$ (arsenic) ion beam or the like that is used for the ion implantation for a semiconductor in the ion source shown in FIG. 1. In this case, the $P^+$ or $As^+$ ion beam can be extracted stably for an extended period of time. If a $BF_3$ gas is introduced in order to obtain $B^+$ ion beam necessary for the ion implantation for a semiconductor, however, two problems develop, which have made it difficult so far to obtain stably a high current ion beam for an extended period of time:

(1) deposit at the ion beam extraction opening portion (i.e., ion beam exit slit 7); and
(2) deposit inside the discharge chamber 5.

If the deposit of the item (1) occurs, the opening area is reduced so that the extracted beam current drops. In a conventional ion source, the gas inlet 10 is positioned near the center of the discharge chamber 5. Therefore, if plasma is generated by a halide gas such as $BF_3$, boron nitride (BN) constituting the lining 5a of the discharge chamber 5, particularly its portion near the gas inlet 10, is etched, and an etching product (most of which is BN) precipitates at the other portions, particularly at the ion beam exit slit 7. In consequence, the slit width is reduced, and the current drops eventually. According to an experiment which uses $BF_3$ gas as the feed gas, the area of the opening portion is reduced almost by half in the course of the operation of the ion source for about four hours. When the deposit is hit by the plasma or ion beam, it is peeled off from the ion beam exit slit 7 and flies sometimes into the space to which an electric field for extracting the ions is applied. The peeled matter strikes the electrode 8b and generates secondary electron emission, which in turn generates an abnormal discharge between the electrode 8a to which a high positive voltage is applied and the electrode 8b to which a high negative voltage is applied. This results in instability of the ion source.

The deposit is often peeled off in the case of (2), too, and the plasma state becomes unstable; and, in addition, an abnormal discharge develops between the electrodes in the same way as in the case of (1), and reduces the stability of the ion source.

If the plasma is generated in a conventional ion source with a halide gas such as $BF_3$, the extracted ion beam current decreases and the stability of the ion source drops, as described above.

It is believed that the reason why the deposit occurs when, e.g., $BF_3$ or $BCl_3$ gas is used is that since the fluorine or chlorine atom generated by microwave discharge is extremely active chemically, it corrodes and dissociates boron nitride (BN) that constitutes the lining 5a of the discharge chamber 5. As a matter of fact, when the deposit is physically analyzed, it is determined to be boron nitride. In order to prevent the occurrence of such a deposit, it is effective to constitute the discharge chamber in a thermally isolated structure, and to raise its operation temperature so as to thermally dissociate or evaporate the deposit. However, the temperature cannot be raised beyond a certain limit due to the structural limitations of the discharge chamber (generally, the approximate upper limit is 800° to 900° C.), and it has been difficult in practice in the past to restrict the quantity of the deposit to a level which presents no practical problems.

As a prior art reference disclosing the state of the art in this field, mention can be made of Japanese Patent Laid-Open No. 132754/1981.

SUMMARY OF THE INVENTION

The present invention is directed to provide an ion source, particularly a microwave ion source, and method of operating such ion source to produce an ion beam, which can eliminate the problems with the prior art described above, which does not reduce the width of an ion beam exit slit even when a halide gas such as $BF_3$ or $BCl_3$ is used as a feed gas to be introduced into a discharge chamber, and which makes it possible to stably extract an intended ion beam for an extended period of time.

To accomplish these objects, the ion source in accordance with the present invention is equipped with a gas inlet (for the feed gas) in close proximity of an ion beam exit slit for extracting ions from the plasma of the feed gas introduced into a discharge chamber. The effect of the present invention can be further enhanced by providing, as the feed gas utilized in the discharge chamber, a mixture of gases which includes at least one gas selected from the above-mentioned boron halide gases and at least one gas which reacts with boron to form a boron compound, such as oxygen, hydrogen or an oxygen-containing compound gas.

If d is the distance between the gas inlet (that is, the middle of the aperture of the gas inlet) and the end surface of the discharge chamber on which the ion beam exit slit is disposed, d should be up to $2d'$, and preferably is up to $d'$, $d'$ being the distance between the wall of the portion of the discharge chamber at which the gas inlet is disposed and the wall opposing the former; and if the gas inlet is positioned closer to the ion beam exit slit, a better result can be obtained In the structure described above in which the gas inlet is disposed in the proximity of the ion beam exit slit, the gas pressure is elevated in the proximity of the ion beam exit slit, and the portion of the exit slit is etched in the same way as the walls inside the discharge chamber, thereby making it possible to reduce the deposit onto the exit slit portion.

The quantity of the gas which reacts with boron to form a boron compound and which is to be mixed with the halide gas is at least 0.1% of the halide gas in a pressure ratio, and the effect of the invention increases remarkably as reactive gas quantity increases. If the gas quantity is below 0.1%, the effect of the invention cannot be observed. As the quantity of the mixing gas such as oxygen increases, the quantity of the intended ions contained in the extracted ion beam decreases in proportion to the mixing quantity, so that the upper limit of the mixing is determined in accordance with the object of use of the ion source. When the mixing gas is hydrogen, its mixing quantity is the same as for oxygen described above. Examples of the oxygen-containing compounds described already include $CO$, $CO_2$, $NO$, $N_2O$, $SO_2$ and $H_2O$. The mixing gas may be any one of the above-mentioned gases of hydrogen, oxygen and various compounds containing oxygen, but two or more of these gases may be mixed and be used as the mixing gas. Addition of the mixing gas such as oxygen to the gas to be utilized in the discharge chamber provides naturally the effect of the invention in combination with disposition of the gas inlet in the proximity of the ion beam exit slit, but when it is used alone, addition of the mixing gas stabilizes ion beam extraction, and thereby provides beneficial results by itself.

Microwaves in a magnetic field are generally used as a plasma generation means, and can also be used for the ion source of the present invention.

Besides application to ion source plasmas, the field of utilization of the plasma generated by microwave discharge in the magnetic field includes etching of Si by plasma. It is generally known that the etching rate drops due to the mixture of oxygen depending on the microwave plasma etching. It is known that when the $B^+$ beam is extracted by introducing $BF_3$ into the microwave ion source, relatively great quantities of ions of oxygen-containing compounds such as $BO^+$, $BOF^+$ or the like are detected as being generated if $H_2O$ as the residual gas inside a vacuum chamber is great. It can be understood from the above that if $O_2$ is positively mixed with the feed gas for the microwave ion source, deposition can be prevented because etching of BN as the material of the discharge chamber can be restricted, and at the same time the dissociated BN molecules change to $BO^+$, $BOF^+$, and the like.

Even if deposition occurs, it escapes in the form of $BO^+$, $BOF^+$, or the like, so that a remarkable reduction of the deposition rate can be expected.

As an ion source for obtaining $B^+$ ion beam of a mA class, an ion source utilizing low voltage arc discharge with a hot filament is known. $BF_3$ is also used for such an ion source. Since the hot filament is rapidly corroded by oxygen, operation of the ion source for an extended period cannot be expected even if oxygen ($O_2$) is introduced in order to obtain a stable $B^+$ beam. In this sense, introduction of $O_2$ is a method which can be characterizingly used for a microwave ion source not containing a hot filament.

In the description above, oxygen is used as a typical example, but the effect of reduction of deposition can be obtained with those gases which react with boron and which readily form a boron compound, such as $H_2$ gas.

Heretofore known techniques or knowledge in the field of ion sources can be used for the ion source of the present invention for those matters which are not particularly described in this specification.

DESCRIPTION OF PREFERRED EMBODIMENTS

Figure 1:
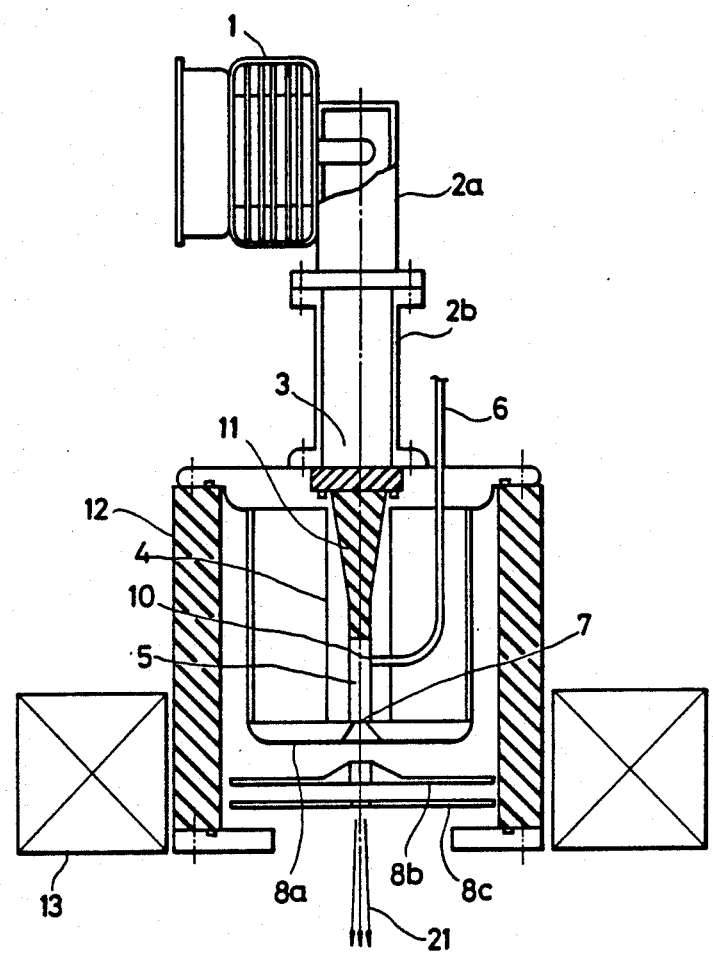
FIG. 1 is a schematic illustration showing the structure of a conventional microwave ion source.
Figure 2:
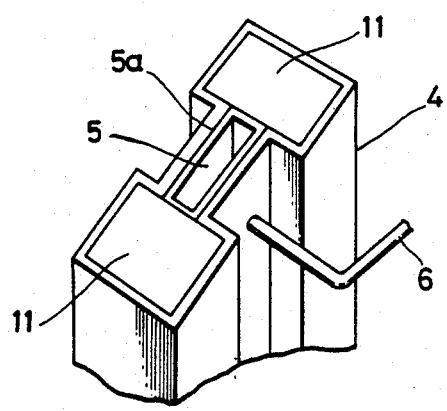
FIG. 2 is a perspective view showing a discharge chamber and portions nearby.
Figure 3:
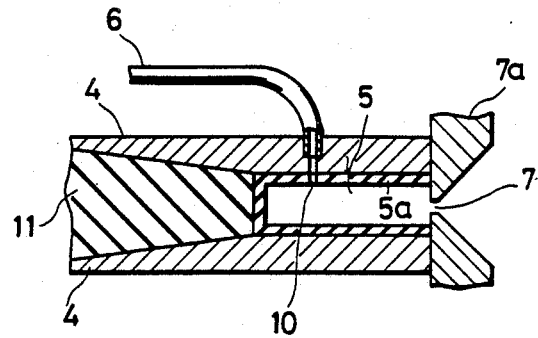
FIG. 3 is a sectional view showing the discharge chamber and portions nearby.
Figure 4:
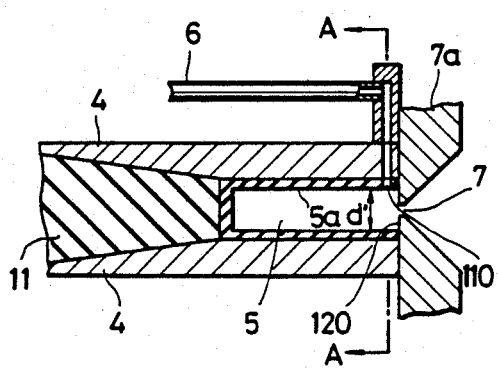
FIG. 4 is a sectional view showing the discharge chamber and portions nearby in a microwave ion source in accordance with one embodiment of the present invention.
Figure 5:
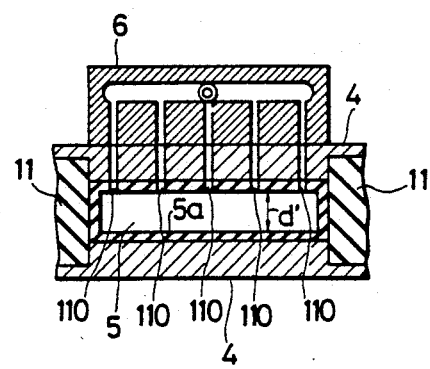
FIG. 5 is a sectional view taken along line A—A of FIG. 4.

Embodiment 1:

FIGS. 4 and 5 are sectional views, each showing the structure of a discharge chamber and portions nearby in a microwave ion source in accordance with a first embodiment of the present invention, and FIG. 5 is a sectional view taken along line A—A in FIG. 4.

This embodiment uses microwave discharge in a magnetic field as means for generating plasma. The microwave is introduced into the discharge chamber 5 from the left side of FIG. 4 through the space between the discharge electrodes 4. The magnetic field is applied in a direction crossing an electric field by the microwave, and the interaction of these fields generates the plasma of the feed gas inside the discharge chamber 5. Ion beam 21 is extracted from an ion beam exit slit 7 which is disposed on one end surface of the discharge chamber. The feed gas is introduced into the discharge chamber 5 through a plurality of gas inlets 110 (five inlets are shown in FIG. 5) that are disposed in the proximity of the ion beam exit slit. As described earlier, the distance d between these gas inlets 110 and the end surface 120 of the discharge chamber on which the exit slit 7 is disposed should be smaller than $2d'$, and is preferably smaller than $d'$, which is the distance between the wall surface on which the gas inlets are disposed and the wall surface of the discharge chamber 5 facing the former. When a halide gas such as $BF_3$ is used as the feed gas in this embodiment, the deposit at the ion beam exit slit 7 can be reduced because the inner walls of the discharge chamber 5 close to the gas inlets 110 and the surface exposed to the plasma at the ion beam exit slit 7 are also etched.

As an example, the diameter of the gas inlet 110 is 2 mm, the length of the ion beam exit slit 7 is substantially the same as that of the discharge chamber, the thickness of the slit 7 is about 1 mm, and the discharge chamber 5 is 8 mm wide, 20 mm deep and 46 mm long. In this example, d is 2 mm and d' is 8 mm. Thus, in this example, d is ¼ d'. The same material is used for each portion as used in the prior art device. That is, the discharge electrode 4 is made of stainless steel, the dielectric filler 11 is made of BN, the lining 5a of the discharge chamber is made of BN, and carbon is used for the portion 7a in the proximity of the ion beam exit slit 7.

Figure 6:
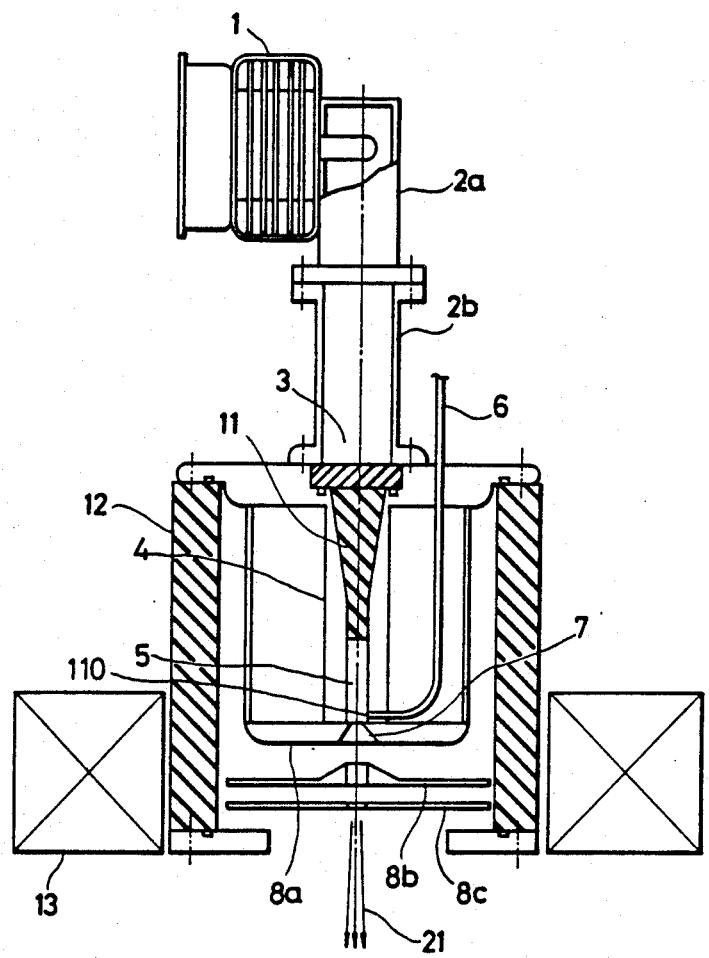
FIG. 6 is a schematic illustration showing the overall structure of the microwave ion source in accordance with one embodiment of the present invention.

FIG. 6 is a schematic illustration showing the overall structure of the microwave ion source of this embodiment.

Next, the disposition of the gas inlets in this embodiment will be examined in detail.

Figure 7:
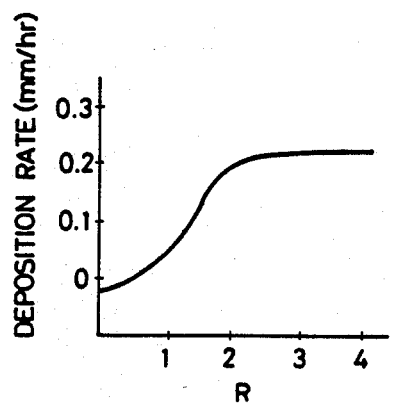
FIG. 7 is a diagram showing the relation between the position of gas inlets and the deposition rate at an ion beam exit slit.

FIG. 7 is a diagram showing the relation between the position of the gas inlets 110 and the deposition quantity of the deposit at the ion beam exit slit. The abscissa represents d/d' ratio (R) wherein d' is the distance between the gas inlet and the inner wall of the discharge chamber facing the gas inlet and d is the distance between the end surface of the discharge chamber on which the ion beam exit slit is disposed and the gas inlet (that is, the center of the aperture thereof), and the ordinate represents the deposition rate (mm/hr). The ion beam exit slit and the discharge chamber have the same structure as described already. The microwave power to be charged into the plasma is 800 W, the intensity of magnetic field is 500 Gauss, and the feed gas quantity expressed in terms of pressure is $1 \times 10^{-1}$ Pa, and these values are kept constant. A negative deposition rate indicates that the ion beam exit slit has been etched. As can be seen clearly from FIG. 7, undesirable deposition occurs greatly in the region where $R > 2$. Within the range of $0 \leq R \leq 2$, the effect of the present invention can be observed, and the smaller the value R, the smaller the deposition quantity. Particularly in the region where $R \leq 1$, an operating life sufficient for practical use as an ion source for an ion implanter can be obtained. In other words, (implant current)×(implant time)=40 mA.hr can be achieved. In accordance with the prior art, the operating life is at most 10 mA·hr. According to an experiment, life has been found to be more than 120 mA.hr (the ion source can be used for more than 30 hours at 4 mA) when R=0.25.

Figure 8A:
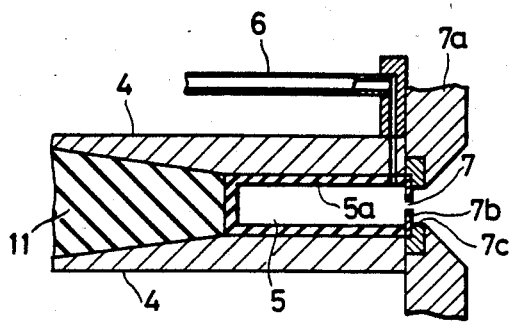
FIGS. 8a and 8b are sectional and plan views showing the discharge chamber and portions nearby in the microwave ion source in accordance with another embodiment of the present invention, respectively.
Figure 8B:
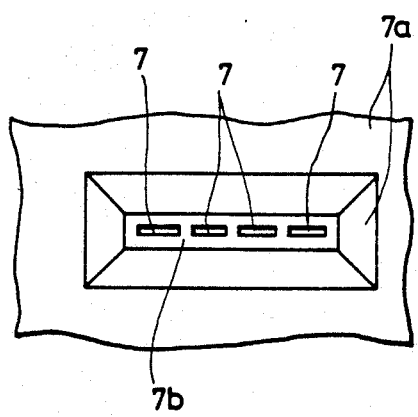

Embodiment 2:

FIGS. 8a and 8b are sectional and plan views showing a discharge chamber and portions nearby in a microwave ion source in accordance with a second embodiment of the present invention. The feed gas is introduced into the discharge chamber in the same way as in the first embodiment shown in FIG. 4. In this embodiment, the ion beam exit slit is divided into a plurality of units in a thermally isolated state so that the temperature of the portions of the ion beam exit slit 7 which are exposed to plasma (e.g., the portions adjacent the aperture) can be further raised. The ion beam exit slit 7 in this embodiment consists of three members 7a, 7b and 7c, whereby, as an example, 7a is made of stainless steel, 7b is made of an electrically conductive composite material of electrically conductive BN and Ti, and 7c is made of carbon. By employing this split structure, the ion beam exit slit 7 is thermally isolated and consists of a plurality of units as shown in FIG. 8b. This split structure raises the temperature of BN by thermally isolating the slit 7, and makes the slit 7 more readily etchable when the discharge gas passes therethrough.

This embodiment can further enhance the etching effect of the ion beam exit slit 7 by the feed gas, and can eliminate the deposit on the ion beam exit slit 7.

Figure 9:
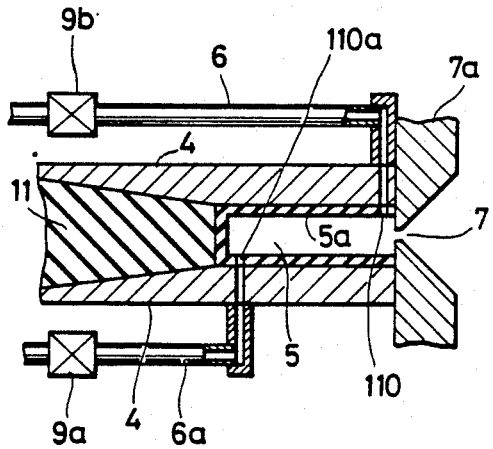
FIG. 9 is a sectional view showing the discharge chamber and portions nearby in the microwave ion source in accordance with still another embodiment of the present invention.

Embodiment 3:

FIG. 9 is a sectional view showing the structure of the discharge chamber of the microwave ion source and portions nearby in accordance with a third embodiment of the present invention. The feed gas is introduced into the discharge chamber through the gas inlet 110 disposed close to the ion beam exit slit 7 and through a gas inlet 110a which is additionally disposed on the surface at the depth of the discharge chamber 5 (e.g., near the end of chamber 5 opposite to the end thereof having the exit slit 7—the chamber surface at the left in FIG. 9). The gas introduction pipes 6 and 6a communicating with these two gas inlets 110 and 110a have separate gas flow rate control valves 9a and 9b, respectively, and can independently control the gas flow rate. This embodiment can uniformly reduce the deposit inside the discharge chamber 5 by adjusting the respective gas flow rates to match the state of deposit at the ion beam exit slit 7 and on the deep surface of the discharge chamber 5.

Figure 10:
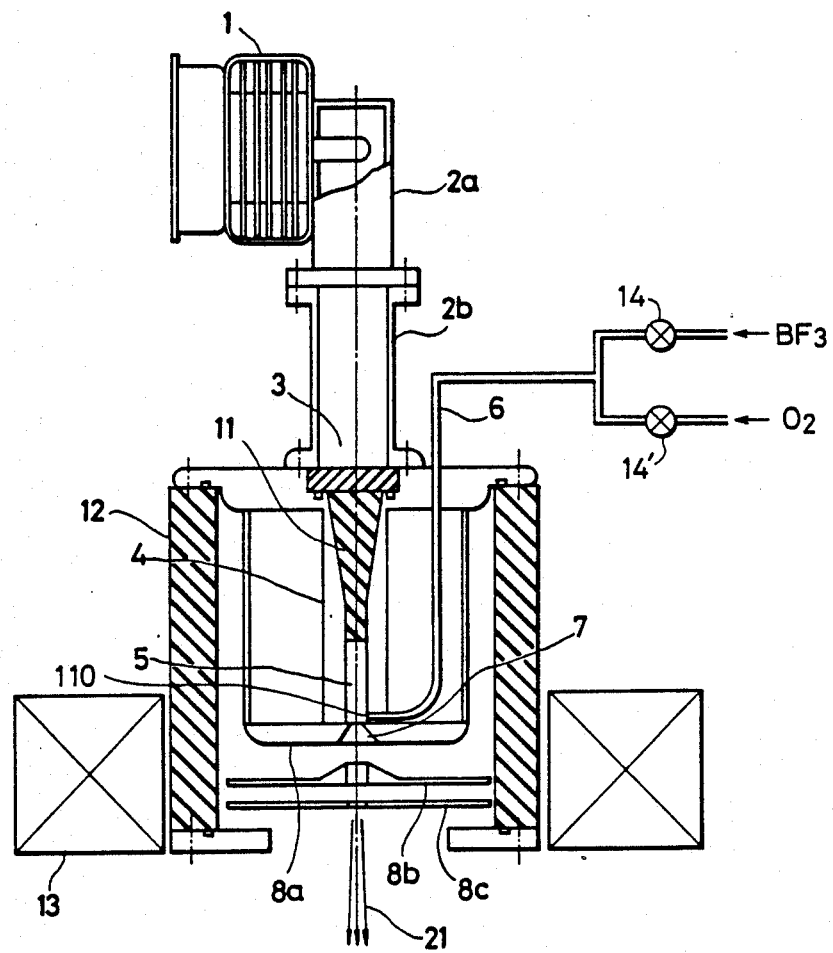
FIGS. 10 and 11 are schematic illustrations showing the overall structure of the microwave ion source in accordance with other embodiments of the present invention, respectively.

Embodiment 4:

This embodiment is the same as the ion source shown in the first embodiment except that leak valves 14 and 14' are fitted to the gas introduction pipe 6 as shown in FIG. 10, and a gas mixture, boron trifluoride ($BF_3$) and oxygen ($O_2$), is introduced.

When the mixing quantity of $O_2$ is changed to 5%, 10% and 20%, of $BF_3$ in pressure ratio, the proportion of $B^+$ contained in the extracted ion beam tends to decrease somewhat in proportion to the concentration of $O_2$, but no deposit is seen occurring in any case inside the discharge chamber 5 and at the portion of the ion beam exit slit 7. As a result, a $B^+$ beam of at least 60 keV and at least 4 mA can be stably obtained for more than four hours by mass-separating the ion beam extracted from the ion source with a sector magnet mass separator. The effect of reducing the deposit can be seen occurring from the 0.1% $O_2$ concentration with respect to the pressure of the $BF_3$, and can also be seen increasing with an increasing $O_2$ concentration.

Besides the generation of various atom and molecule ions, large quantities of chemically active, neutral atoms and molecules are generated in the plasma. Their quantities and component ratios vary in a complicated manner with microwave power, temperature, gas pressure, and so forth. For this reason, chemical analysis in further detail will be necessary in order to clarify the reason why discharge free from the deposit can be maintained by introducing $O_2$.

A similar effect can be obtained when boron trichloride ($BCl_3$) is used in place of $BF_3$.

Figure 11:
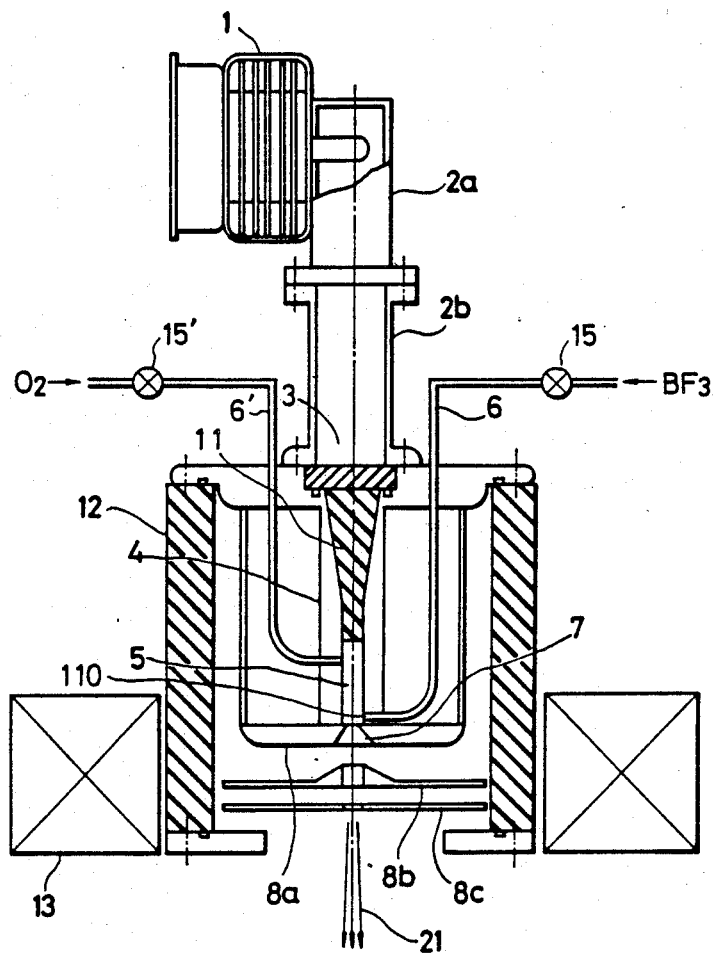

Embodiment 5:

The microwave ion source in accordance with a fifth embodiment of the invention is the same as the ion source of the fourth embodiment except that $BF_3$ and $O_2$ are introduced into the discharge chamber 5 through separate gas introduction pipes 6 and 6', as shown in FIG. 11. A stable $B^+$ beam free from deposition can be obtained in this embodiment in the same way as in the fourth embodiment shown in FIG. 10. Reference numerals 15 and 15' in FIG. 11 represent the leak valves, respectively.

Embodiment 6:

The fourth and fifth embodiments of the invention shown in FIGS. 10 and 11, respectively, mix the gases with the two needle valves. However, if a gas tank storing therein a mixed gas is used, the mixed gas can be introduced into the discharge chamber through one needle valve as shown in FIG. 6, and the same effect as those of the fourth and fifth embodiments can be obtained.

Embodiment 7:

When an oxygen-containing gas such as $CO_2$ is used as the gas to be mixed with $BF_3$ or $BCl_3$ in place of oxygen used in the fourth, fifth and sixth embodiments, the same effect as when oxygen is introduced can be obtained. A stable $B^+$ beam can be obtained similarly when two or more kinds of oxygen-containing gases are mixed.

Embodiment 8:

When about 10% $H_2$ is mixed in place of $O_2$ with $BF_3$ in the fourth, fifth and sixth embodiments of the invention, a stable $B^+$ beam can be extracted without causing any deposition.

It is known that among boron compounds, hydrogen compounds such as $B_2H_6$ are relatively stable. It is therefore believed that when $H_2$ is mixed, the reactive hydrogen radical particles react with the deposit or the like, thereby exhibiting the effect of reducing deposition.

As described above, even when a halide such as $BF_3$ or $BCl_3$ is used as the feed gas, the present invention can prevent the deposition on the ion beam exit slit, and hence can extract ions stably for an extended period of time. For example, a $B^+$ ion beam of at least 4 mA, which has not so far been accomplished by the prior art ion source, can now be obtained for 4 or more hours stably. In view of the fact that an ion implant current of a semiconductor ion implanter on a production line remains at about 2 mA at present, the present invention makes it possible for the first time to carry out high current $B^+$ ion implantation at a practical level, and provides a great effect in practice.

Obviously many modifications and variations of the present invention are possible in light of the above teachings. It is therefore to be understood that within the scope of the appended claims, the invention may be practised otherwise than as specifically described herein.

What is claimed is:

1. An ion source including a microwave discharge chamber adapted to have a plasma therein generated in a feed gas introduce therein, a gas inlet for introducing said feed gas into said discharge chamber, and an ion beam exit slit for extracting ions from said plasma generated in the feed gas introduced into said discharge chamber, wherein the ion beam exit slit is located on an end surface of the discharge chamber, and wherein the distance d between the end surface of said discharge chamber on which said ion beam exit slit is disposed and said gas inlet, and the distance d' between the wall surface of the portion of said discharge chamber on which said gas inlet is disposed and a wall surface facing the former, satisfy the relation $d \leq 2d'$, so as to reduce deposition onto the ion beam exit slit as compared to the deposition thereon when the distances d and d' do not satisfy said relation.

2. The ion source according to claim 1 wherein said d and said d' satisfy the relation $d \leq d'$.

3. The ion source according to claim 1, wherein another gas inlet for feeding gas to the discharge chamber is disposed at a portion of the chamber other than close to said ion beam exit slit to match a state of deposit at the ion beam exit slit and on a surface of the discharge chamber other than close to said ion beam exit slit.

4. The ion source according to claim 3, further including a gas introduction pipe communicating with said gas inlet and another gas introduction pipe communicating with said another gas inlet, and in which a gas flow rate control valve is disposed in each of said gas introduction pipes.

5. The ion source according to claim 1, wherein another gas inlet for feeding gas to the discharge chamber is disposed at a portion of the chamber other than close to said ion beam exit slit, and wherein said gas inlet is adapted to feed at least one halide gas selected from the group consisting of boron halide gases to the discharge chamber, and said another gas inlet is adapted to feed at least one gas which reacts with boron and forms a boron compound, the ion source further including means, associated with the ion beam exit slit, for extracting a $B^+$ ion beam.

6. The ion source according to claim, wherein said ion beam exit slit is divided into a plurality of portions, and the portions close to the aperture formed by the slit are thermally isolated.

7. The ion source according to claim 6, wherein electrically conductive boron nitride is used for at least a part of a portion constituting said ion beam exit slit.

8. The ion source according to claim 1, which further includes a magnetic field generator and a microwave generator in order to generate said plasma.

9. The ion source according to claim 8, wherein said gas inlet is adapted to feed a feed gas that is a mixed gas prepared by mixing at least one halide gas selected from the group consisting of boron halide gases with at least one gas which reacts with boron and forms a boron compound, the ion source further including means, associated with the ion beam exit slit, for extracting a $B^+$ ion beam.

10. The ion source according to claim 9, wherein said boron halide gas is at least one member selected from the group consisting of boron trifluoride and boron trichloride, and said at least one gas which reacts with boron and forms a boron compound is at least one member selected from the group consisting of oxygen gas, hydrogen gas, and gas of an oxygen-containing compound and their mixtures.

11. The ion source according to claim 10, wherein said gas of an oxygen-containing compound is CO, $CO_2$, NO, $N_2O$, $SO_2$ or $H_2O$.

12. The ion source according to claim 10, wherein said at least one gas which reacts with boron and forms a boron compound is oxygen.

13. The ion source according to claim 10, wherein said at least one gas which reacts with boron and forms a boron compound is hydrogen.

14. The ion source according to claim 9, further comprising means for mixing said halide gas and said at least one gas which reacts with boron and forms a boron compound, and means for feeding the gas mixture to the gas inlet, and wherein the means for mixing is adapted to provide a gas mixture wherein the quantity of said gas which reacts with boron is at least 0.1% of said halide gas in terms of pressure ratio.

15. An ion source including a microwave discharge chamber adapted to have a pasma therein generated in a feed gas introduced therein, an ion beam exit slit for extracting ions from said plasma generated in the feed gas introduced into said discharge chamber, and feed means for feeding at least said feed gas to the discharge chamber, wherein said feed means includes means for feeding a boron halide gas and means for feeding a gas which reacts with boron and forms a boron compound, so as to provide boron ions while preventing deposition of boron compounds on the surface of the discharge chamber and on the ion beam exit slit.

16. The ion source according to claim 15, further comprising a source of said boron halide gas and a source of said gas which reacts with boron, said source of said born halide gas being in flow communication with said means for feeding the boron halide gas, and the source of the gas which reacts with boron being in flow communication with the means for feeding the gas which reacts with boron.

17. A method of forming an ion beam comprising the steps of passing a feed gas to a microwave discharge chamber, forming a plasma from said feed gas in said chamber, and extracting ions, in an ion beam, from said plasma, wherein said feed gas includes a boron halide gas and a gas which reacts with boron and forms a boron compound, so as to provide boron ions while preventing deposition of boron compounds on the surface of the discharge chamber and on the ion beam exit slit.

18. The method of forming an ion beam according to claim 17, wherein the boron halide gas is selected from the group consisting of boron trifluoride and boron trichloride.

19. The method of forming an ion beam according to claim 18, wherein the gas which reacts with boron and forms a boron compound is selected from the group consisting of oxygen gas, hydrogen gas, a gas of an oxygen-containing compound, and mixtures thereof.

20. The method of forming an ion beam according to claim 19, wherein said gas on an oxygen-containing compound is selected from the group consisting of CO, $CO_2$, NO, $N_2O$, $SO_2$ and $H_2O$.

21. The method of forming an ion beam according to claim 17, wherein the quantity of the gas which reacts with boron fed to the discharge chamber is at least 0.1% of the boron halide gas in a pressure ratio.

22. A method of forming an ion beam comprising the steps of passing feed gas to a microwave discharge chamber, forming a plasma from said feed gas in said chamber, and extracting ions, in an ion beam, from said plasma, said ions being extracted from the discharge chamber through an ion beam exit slit, wherein the ion beam exit slit is located on an end surface of the discharge chamber, and wherein the distance d between the end surface of said discharge chamber on which said ion beam exit slit is disposed and the location where the feed gas is passed into the discharge chamber, and the distance d' between the wall surface at the location where the feed gas is passed into the discharge chamber and a wall surface facing the former, satisfy the relation $d \leq 2d'$ so as to reduce deposition onto the ion beam exit slit as compared to the deposition thereon when the distances d and d' do not satisfy said relation.

23. The method of forming an ion beam according to claim 22, wherein said feed gas includes a boron halide gas, and wherein a gas which reacts with boron and forms a boron compound is also passed into the discharge chamber.

24. The method of forming an ion beam according to claim 23, wherein the feed gas, fed to the discharge chamber, is a mixture of said boron halide gas and said gas which reacts with boron, said mixture being fed at a location so as to satisfy said relation.

25. The method of forming an ion beam according to claim 23, wherein the feed gas passed so as to satisfy said relation is said boron halide gas, and wherein said gas which reacts with boron is passed into the discharge chamber further from the exit slit than the location at which feed gas fed at a location so as to satisfy said relation is passed into the discharge chamber.

26. The method of forming an ion beam according to claim 23, wherein the feed gas is fed at a first inlet so as to satisfy said relation and at a second inlet spaced further than said first inlet from said exit slit, with the feed gas fed at the first and second inlets being fed at independently controlled rates to match a state of deposit at the ion beam exit slit and on a surface of the discharge chamber other than close to said ion beam exit slit.

27. The method of forming an ion beam according to claim 22, wherein said feed gas is passed into the discharge chamber sufficiently close to the exit slit such that deposits are not formed on the exit slit.

28. The ion source according to claim 1, further comprising a microwave generator for generating the plasma.

29. The ion source according to claim 15, further comprising a microwave generator for generating the plasma.

30. The method of forming an ion beam according to claim 17, wherein said plasma is formed using microwaves transmitted to the discharge chamber.

31. The method of forming an ion beam according to claim 22, wherein said plasma is formed using microwaves transmitted to the discharge chamber.

32. The ion source according to claim 15, wherein said means for feeding a gas which reacts with boron and forms a boron compound is a means for feeding said gas in an amount of at least 0.1% of the boron halide in a pressure ratio.

33. The method of forming an ion beam according to claim 17, wherein said gas which reacts with boron and forms a boron compound is hydrogen.

* * * * *